United States Patent [19]

Tanaka et al.

[11] Patent Number: 5,276,645
[45] Date of Patent: Jan. 4, 1994

[54] SEMICONDUCTOR MEMORY WITH REDUCED PEAK CURRENT

[75] Inventors: Takayuki Tanaka; Junichi Suyama, both of Tokyo, Japan

[73] Assignee: Oki Electric Industry Co., Ltd., Tokyo, Japan

[21] Appl. No.: 861,950

[22] Filed: Apr. 2, 1992

[30] Foreign Application Priority Data

Apr. 10, 1991 [JP] Japan .................. 3-077994

[51] Int. Cl.⁵ .............................. G11C 7/00
[52] U.S. Cl. .................. 365/189.07; 365/149; 365/203
[58] Field of Search .......... 365/149, 189.07, 189.01, 365/203, 204, 206, 207, 242

[56] References Cited

U.S. PATENT DOCUMENTS 4,144,590  3/1979  Kitagawa et al. .......... 365/203
4,926,383  5/1990  Kertis et al. .......... 365/189.01

Primary Examiner—Eugene R. LaRoche
Assistant Examiner—Tan Nguyen
Attorney, Agent, or Firm—Edward D. Manzo

[57] ABSTRACT

A semiconductor memory has sense amplifiers coupled to complementary pairs of bit lines. A first switching element couples the sense amplifiers to a first potential, so that the sense amplifiers can bring one bit line in each pair of bit lines from a precharged state to the first potential. A second switching element couples the sense amplifiers to a shunt node. A third switching element couples the shunt node to the first potential. A capacitor capacitively couples the shunt node to a second potential different from the first potential.

12 Claims, 5 Drawing Sheets

SEMICONDUCTOR MEMORY WITH REDUCED PEAK CURRENT

BACKGROUND OF THE INVENTION

This invention relates to a semiconductor memory such as a dynamic random-access memory (DRAM) or static random-access memory (SRAM), more particularly to a semiconductor memory having reduced peak operating current.

A semiconductor memory comprises a rectangular array of memory cells connected to pairs of complementary bit lines running in the column direction of the array. Sense amplifiers connected to the bit line pairs amplify small potential differences between the bit lines by allowing the bit lines to charge to the power supply potential or discharge to the ground potential. In prior-art semiconductor memory devices, a single switching element switches all the charge or discharge current from the sense amplifiers to or from a power supply or ground terminal.

In semiconductor memory devices with a large number of columns the sense amplifiers must charge or discharge a large number of bit lines, creating a considerable current surge that can in turn cause noise on the power supply or ground lines. A further problem is that parasitic resistance between the switching element and the power supply or ground impedes the current flow, thereby limiting the speed of operation of the memory. In effect, the voltage drop across the parasitic resistance alters the potential at a power supply or ground node adjacent to the switching element, leaving less electromotive force with which to charge or discharge the bit lines, thus lowering the current driving ability of the switching element. This tends to limit the practical size of the memory cell array.

SUMMARY OF THE INVENTION

It is therefore an object of the present invention to reduce current surge in semiconductor memories.

Another object of the present invention is to reduce noise in semiconductor memories.

Yet another object of the present invention is to increase the access speed of semiconductor memories.

Still another object of the present invention is to enable semiconductor memories to have large memory cell arrays.

A further object of the present invention is to increase the speed of semiconductor memories having multiple memory cell arrays.

A semiconductor memory comprises a memory cell array having a plurality of complementary pairs of bit lines, and a plurality of sense amplifiers coupled to respective complementary pairs of bit lines. A first switching element couples the sense amplifiers to a first potential, so that the sense amplifiers can bring one bit line in each pair of bit lines from a precharged state to the first potential. A second switching element couples the sense amplifiers to a shunt node. A third switching element couples the shunt node to the first potential. A capacitor capacitively couples the shunt node to a second potential different from the first potential. During non-access, the first and second switching element are switched off and the third switching element is switched on. During read access, the third switching element is switched off and the first and second switching element are switched on.

DETAILED DESCRIPTION OF THE INVENTION

Novel dynamic random-access memories having both n-channel sense amplifiers and p-channel sense amplifiers will be described with reference to the drawings. In these memories the bit lines are precharged to a potential intermediate between the ground potential (hereinafter denoted VSS) and the power supply potential (hereinafter denoted VCC). The invention is not limited to memories of this type however, being also applicable to memories in which the bit lines are precharged to a different potential such as VCC, and to memories having only n-channel sense amplifiers or only p-channel sense amplifiers. Nor is the invention limited to dynamic random-access memories; it is applicable to other types of memories as well, such as static random-access memories.

Well-known circuits such as row and column decoders are omitted from the drawings so as not to obscure the novel features of the invention.

Figure 1:
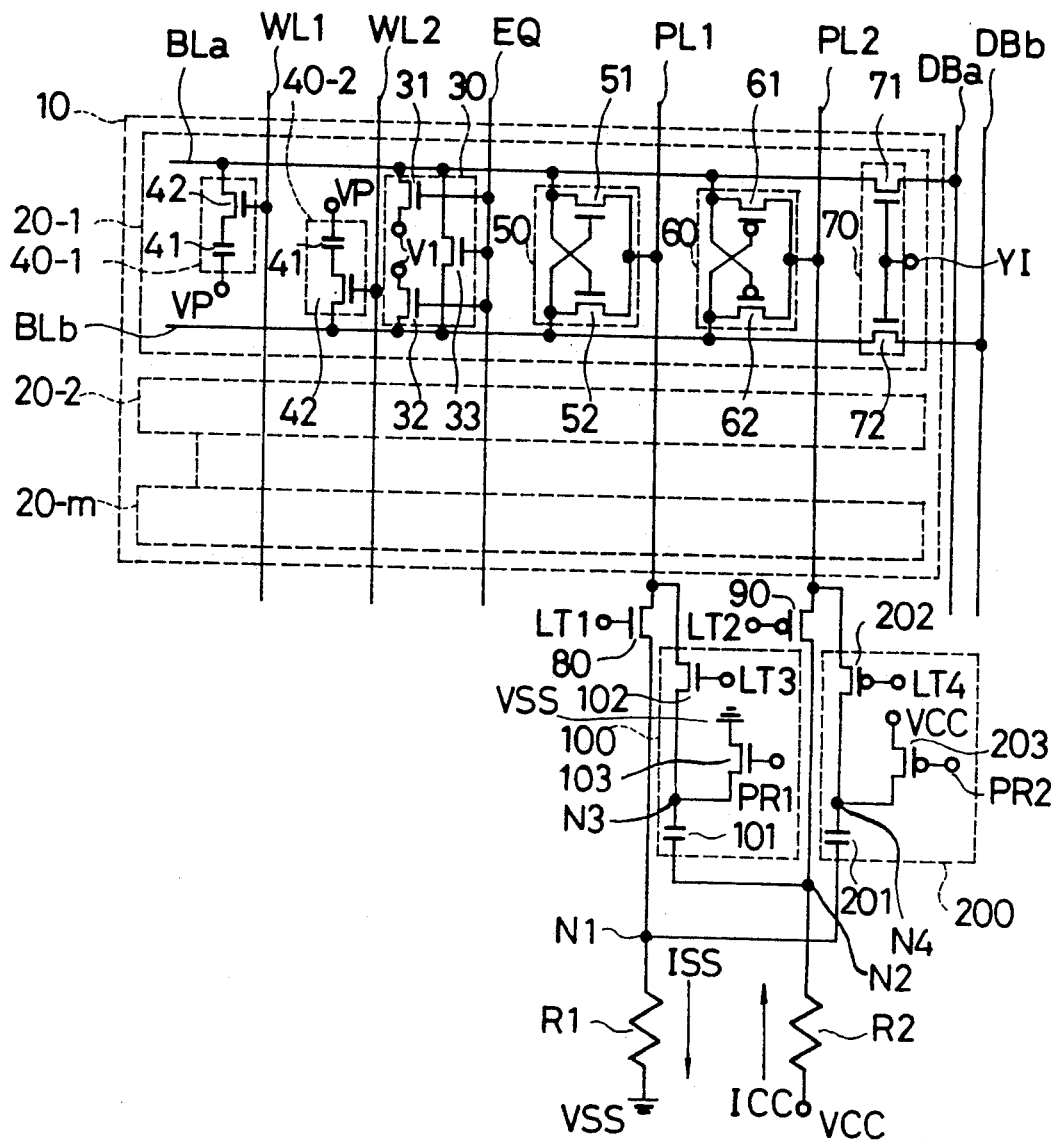
FIG. 1 is a circuit diagram illustrating a first novel semiconductor memory.

Referring to FIG. 1, a dynamic random-access memory comprises a memory cell array 10 organized into a plurality of columns 20-1, 20-2, ..., 20-m. (In the drawing the columns run horizontally.) Each column has a complementary pair of bit lines BLa and BLb to which are connected an equalizing circuit 30, a plurality of memory cells 40-1, 40-2, ..., a first sense amplifier 50, a second sense amplifier 60, and a transfer gate 70.

The equalizer 30 comprises n-channel metal-oxide-semiconductor field-effect transistors (hereinafter referred to as NMOS transistors) 31, 32, 33, the gates of which are connected to an equalize (EQ) signal line. Through the transistors 31 and 32, the bit lines BLa and BLb are coupled to nodes that are held at a fixed potential V1 midway between VSS and VCC. Through the transistor 33, the bit lines BLa and BLb are coupled to each other.

Although only two memory cells 40-1 and 40-2 are shown in the drawing, each pair of bit lines is normally connected to a larger number of memory cells having the same structure as these two. As shown in the drawings, this structure comprises a capacitor 41 and an NMOS transistor 42. The gate of the transistor 42 is coupled to a word line running in the row direction. (The drawing shows only two word lines WL1 and WL2, but normally there are of course more. The row direction is vertical in the drawing.) Through the transistor 42, one electrode of the capacitor 41 is coupled to the bit line BLa or BLb. The other electrode of the capacitor is coupled to a plate node that is held at a fixed potential VP midway between VSS and VCC.

The invention is not limited to this particular memory cell structure. It is also applicable to memories with two-transistor memory cells and other types of memory cells.

The first sense amplifier 50 comprises a pair of NMOS transistors 51 and 52 that are cross-coupled to the bit lines BLa and BLb. Through the transistor 51, the bit line BLa is coupled to the gate of the transistor 52 and a first latch line PL1. Through the transistor 52, the bit line BLb is coupled to the gate of the transistor 51 and the first latch line PL1. The second sense amplifier 60 comprises a pair of p-channel metal-oxide-semiconductor field-effect transistors (hereinafter referred to as PMOS transistors) 61 and 62 that are cross-coupled to the bit lines BLa and BLb and to a second latch line PL2 in a similar manner.

The transfer gate 70 comprises a pair of NMOS transistors 71 and 72 the gates of which are coupled at a node YI to a column decoder circuit not shown in the drawing. Through the transistors 71 and 72, the bit lines BLa and BLb are coupled to respective data lines DBa and DBb by means of which data stored in the memory cell array can be read by external devices.

The latch line PL1 is coupled through an NMOS transistor 80 to the ground potential VSS, and the latch line PL2 is coupled through a PMOS transistor 90 to the power supply potential VCC. The gate of the NMOS transistor 80 is coupled to a latch signal node LT1. The gate of the PMOS transistor 90 is coupled to a latch signal node LT2. The latch signals LT1 and LT2 applied at these nodes have a complementary relationship, LT1 being high when LT2 is low and vice versa.

The latch line PL1 is also coupled through a first shunt circuit 100 to the power supply potential VCC, and the latch line PL2 is coupled through a shunt circuit 200 to the ground potential VSS. The shunt circuit 200 is coupled to the latch line PL2 at a point located above the transistor 90 in the drawing, and to the line linking the transistor 80 to VSS at a node N1 located below the transistor 80 in the drawing. The shunt circuit 100 is coupled to the latch line PL1 at a point located above the transistor 80 in the drawing, and to the line linking the transistor 90 to VCC at a node N2 located below the transistor 90 in the drawing. A parasitic resistance R1 exists between the node N1 and VSS; a parasitic resistance R2 exists between the node N2 and VCC.

The shunt circuit 100 comprises a capacitor 101, an NMOS transistor 102, and an NMOS transistor 103. The transistor 102 couples the latch line PL1 to a shunt node N3. The transistor 103 couples the shunt node N3 to VSS. The capacitor 101 capacitively couples the shunt node N3 to the node N2, hence to VCC.

The shunt circuit 200 comprises a capacitor 201, a PMOS transistor 202, and a PMOS transistor 203. The transistor 202 couples the latch line PL2 to a shunt node N4. The transistor 203 couples the shunt node N4 to VCC. The capacitor 201 capacitively couples the shunt node N4 to the node N1, hence to VSS.

The gates of the NMOS transistor 102 and the PMOS transistor 202 are connected respectively to LT3 and LT4 signal nodes. The LT3 and LT4 signals applied at these nodes have a complementary relationship, one being high when the other is low. The gates of the NMOS transistor 103 and the PMOS transistor 203 are connected respectively to PR1 and PR2 signal nodes. The PR1 and PR2 signals applied at these nodes also have a complementary relationship.

Next the operation of this memory during read access will be described with reference to FIG. 2. In this drawing $\overline{RAS}$ denotes a row address strobe signal, ISS denotes current flowing from node N1 to VSS, and ICC denotes current flowing from VCC to node N2. Other symbols are the same as already described.

During non-access $\overline{RAS}$, WL1, WL2, LT1, LT2, LT3, and LT4 are in the inactive state, while EQ, PR1, and PR2 are in the active state. The active state is the low state for $\overline{RAS}$ and signals coupled to the gates of PMOS transistors (LT2, LT4, and PR2), and the high state for signals coupled to the gates of NMOS transistors (EQ, WL1, WL2, LT1, LT3, and PR1).

Since EQ is active during non-access, the equalizing circuit 30 precharges the bit lines BLa and BLb and latch lines PL1 and PL2 to the V1 level, midway between the VSS level of node N1 and the VCc level of node N2. Since PR1 and PR2 are active, shunt nodes N3 and N4 are precharged to VSS and VCC, respectively. A potential difference of VCC−VSS thus exists across the capacitors 101 and 201.

Read access begins when $\overline{RAS}$ goes low. Shortly thereafter EQ, PR1, and PR2 are driven to the inactive state, placing the bit lines BLa and BLb, latch lines PL1 and PL2, and shunt nodes N3 and N4 in a floating condition. Next the word line in a selected row (WL1 in the drawing) is driven to the active state, connecting one memory cell in each column to its bit line. The charge stored in the capacitor in this memory cell raises or lowers the bit line potential slightly from its precharge value V1. The drawing shows the case in which the charge in the capacitor 41 in the memory cell 40-1 connected to bit line BLa is positive, raising BLa slightly above the V1 potential toward VCC.

Next LT3 and LT4 are driven active, switching on the transistors 102 and 202 and connecting the latch lines PL1 and PL2 to the shunt nodes N3 and N4. Since the latch line PL1 and shunt node N3 are now interconnected they attempt to equalize in potential: the potential of the shunt node N3 begins to rise from VSS and the potential of the latch line PL1 begins to fall from V1. Similarly, the potential of the shunt node N4 begins to fall from VCC while the potential of the latch line PL2 begins to rise from V1.

Due to capacitive coupling through the capacitor 101, the rise in potential at the shunt node N3 is transmitted to node N2, causing it to rise above VCC. Charge current ICC now flows in the reverse direction, from the capacitor 101 through node N2 toward VCC, restoring node N2 to the VCC level. Similarly, node N1 experiences a brief potential excursion downward from VSS, accompanied by a reverse flow of discharge current ISS from VSS through node N1 to the capacitor 201.

Next LT3 and LT4 are driven to the inactive state, switching off the transistors 102 and 202; then LT1 and LT2 are driven to the active state, turning on the transistors 80 and 90. The latch line PL1 is now coupled directly to node N1, so it continues to fall toward VSS. This causes a brief rise in potential at node N1, but node N1 is quickly restored to VSS by flow of discharge current ISS through the parasitic resistance R1. Similarly, the latch line PL2, being coupled to node N2, continues to rise toward VCC, causing a brief potential excursion downward from VCC at node N2 and a flow of charge current ICC.

Due to the cross-coupling of transistors in the sense amplifiers, the bit lines BLa and BLb track the divergence in potential of the latch lines PL1 and PL2. The bit line that was at the higher potential (BLa in the drawing) follows PL2 up toward VCC. The bit line that was at the lower potential follows PL1 down toward VSS. After enough time for the bit lines to reach VCC and VSS, the transfer gate 70 in a selected column is switched on to transfer the potentials on the bit lines in that column to the data lines DBa and DBb, thus reading data from the memory cell at the intersection of the selected row and column. In addition, the charge in the capacitors in all memory cells in the selected row is refreshed.

When $\overline{\text{RAS}}$ goes high again, indicating that the read access cycle has ended, WL1, LT1, and LT2 are driven to the inactive state, decoupling the bit lines BLa and BLb and latch lines PL1 and PL2 from the memory cells and nodes N1, N2, N3, and N4. Then EQ, PR1, and PR2 are driven active, switching on the transistors 31, 32, and 33 in the equalizing circuit 30 and the transistors 103 and 203 in the shunt circuits 100 and 200 to precharge bit lines BLa and BLb and latch lines PL1 and PL2 to the V1 potential, node N3 to the VSS potential, and node N4 to the VCC potential again in preparation for the next access.

The advantages of this read cycle are that the bit line BLb discharges not only through node N1 to VSS but also, by capacitive coupling through node N2, to VCC. Similarly, the bit line BLa charges not only through node N2 from VCC but also, by capacitive coupling through node N1, from VSS. Charge and discharge current therefore flows in both directions at nodes N1 and N2, resulting in reduced surge current and reduced potential variations at these nodes. This enhances the current driving ability of the transistors 80 and 90 and reduces circuit noise.

In this read cycle, first the transistors 102 and 202 were switched on, then these two transistors were switched off, then the transistors 80 and 90 were switched on. Next an alternative read cycle will be described in which the transistors 80, 90, 102, and 202 are switched on simultaneously.

Figure 2:
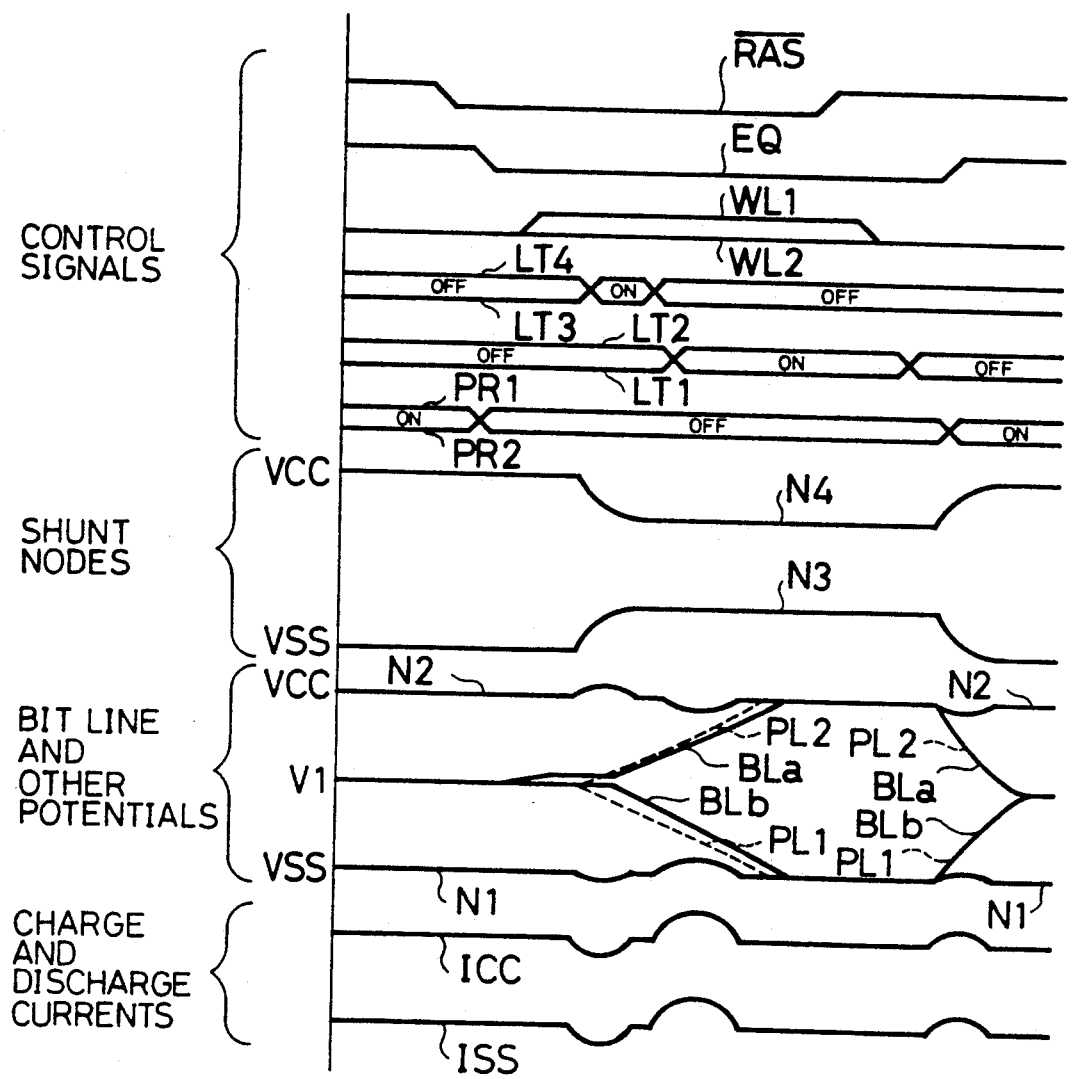
FIG. 2 is a timing diagram illustrating a read cycle of the first novel semiconductor memory.
Figure 3:
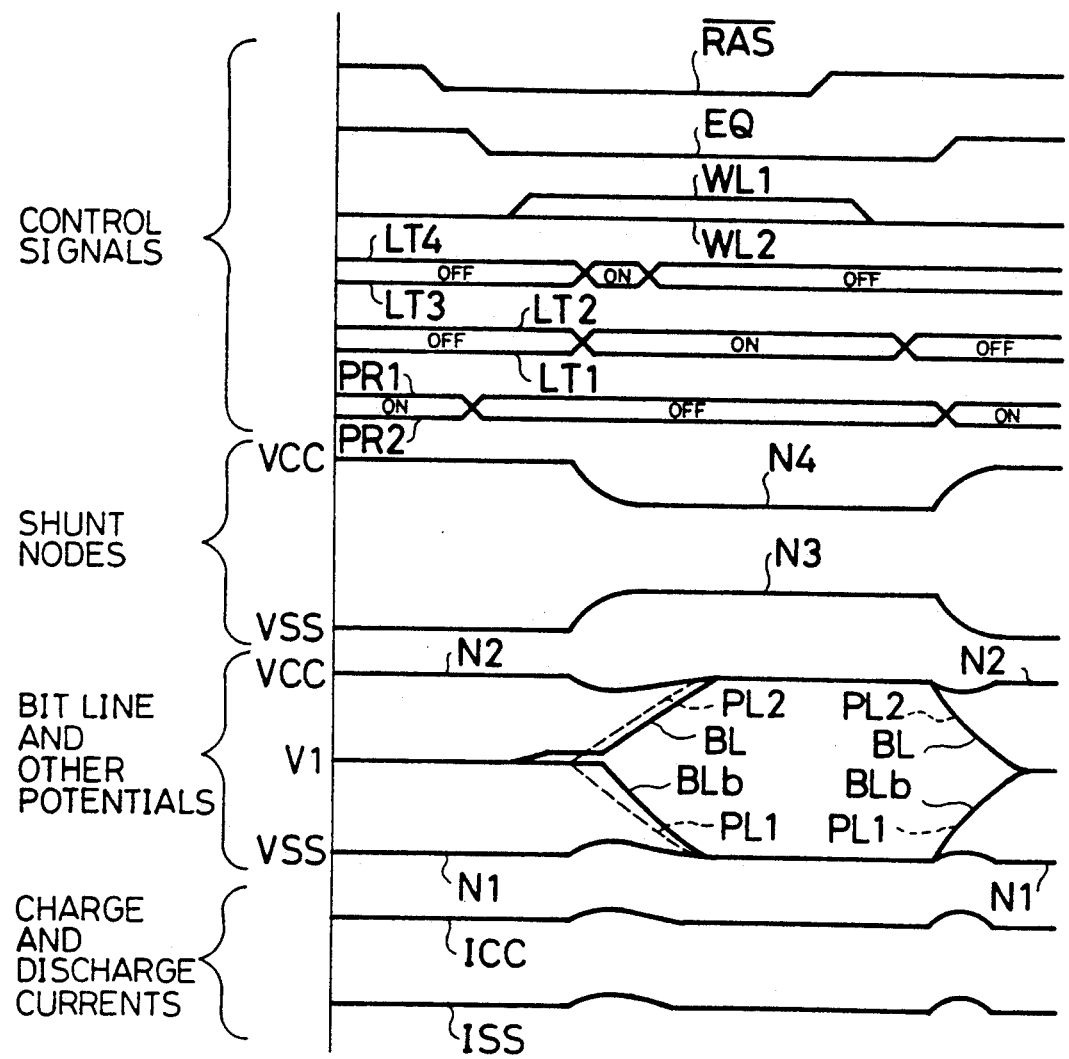
FIG. 3 is a timing diagram illustrating an alternative read cycle of the first novel semiconductor memory.

Referring to FIG. 3, this read cycle is identical to the one in FIG. 2 except that the time at which LT1 and LT2 are activated is advanced to coincide with the activation of LT3 and LT4. The reverse charge current ICC that flowed from the capacitor 101 through node N2 to VCC in FIG. 2 is therefore superimposed on charge current flowing from VCC through node N2 to the latch line PL2, resulting in the comparatively small net charge current illustrated in FIG. 3. Similarly, the reverse discharge current ISS that flowed from VSS through node N1 to the capacitor 201 in FIG. 2 is superimposed on discharge current flowing from the latch line PL1 through node N1 to VSS, resulting in the comparatively small net discharge current ISS in FIG. 3. These currents are accompanied by corresponding small variations in potential at nodes N2 and N1.

Compared with FIG. 2, FIG. 3 has the advantages of reduced peak charge and discharge current and smaller potential variations at nodes N1 and N2. In addition, the bit lines BLa and BLb reach the VCC and VSS levels more quickly, which enables the memory access cycle to be speeded up.

Figure 4:
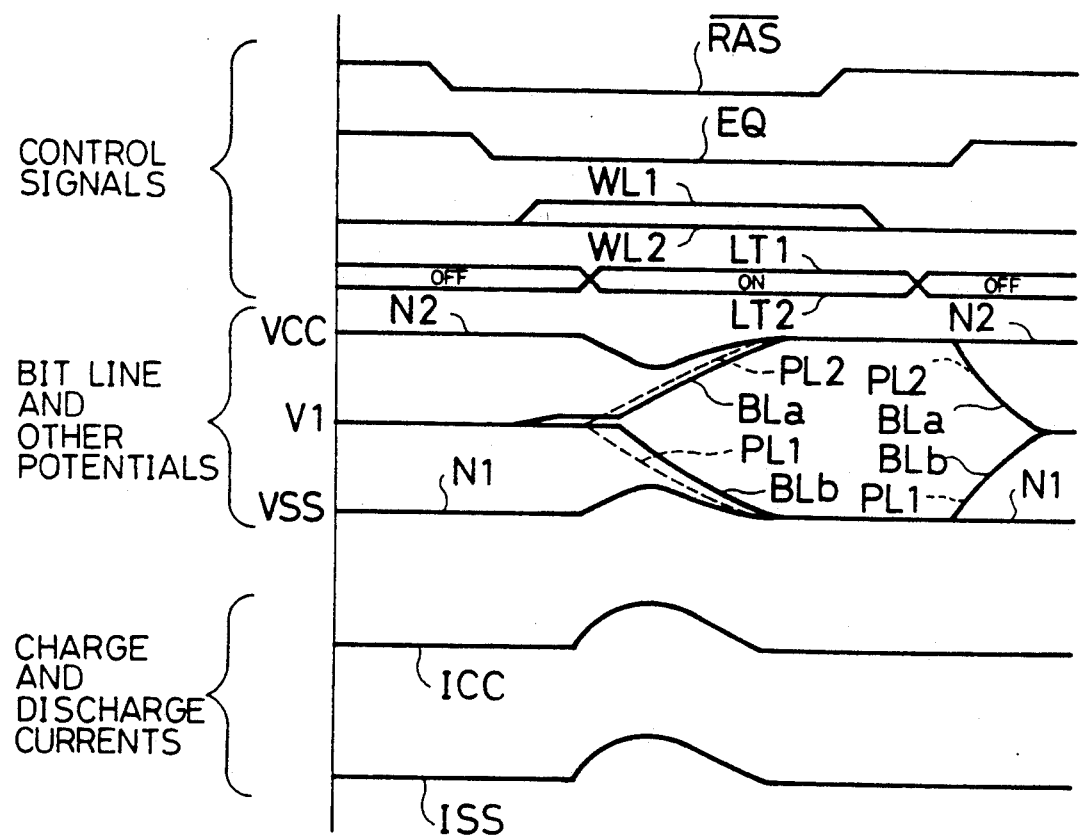
FIG. 4 is a timing diagram illustrating a read cycle of a prior-art semiconductor memory.

The effect of the invention can best be seen by comparing FIGS. 2 and 3 with FIG. 4, which illustrates the operation of a prior-art memory lacking the shunt circuits 100 and 200. In FIG. 4 the latch line PL1 discharges in a single surge to VSS, indicated by the ISS current waveform, accompanied by a large potential drop at node N2, and the latch line PL2 charges in a single surge from VCC, indicated by the ICC current waveform, accompanied by a large potential rise at node N1. The current peaks in FIG. 4 are considerably higher than those in FIG. 2, and much higher than those in FIG. 3, resulting in problems of noise and reduced current driving ability as mentioned earlier. Moreover the bit lines BLa and BLb reach the VCC and VSS levels more slowly than in FIG. 3.

Figure 5:
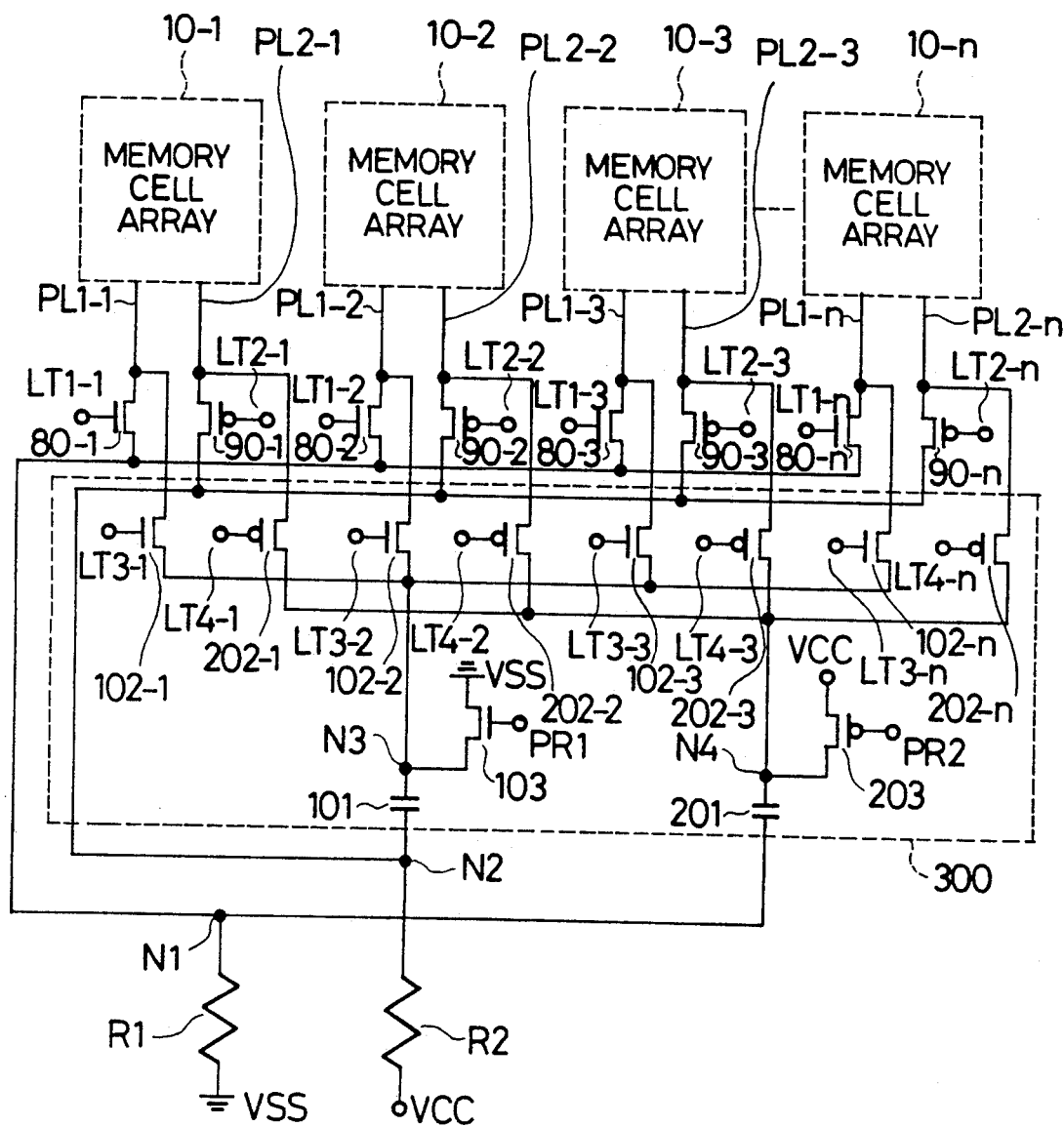
FIG. 5 is a circuit diagram illustrating a second novel semiconductor memory.

FIG. 5 shows another novel dynamic random-access memory having a plurality of memory cell arrays 10-1, 10-2, ..., 10-n each identical to the memory cell array 10 in FIG. 1.

The transistors 80-1, 80-2, ..., 80-n are similar to the transistor 80 in FIG. 1, coupling latch lines PL1-1, PL1-2, ..., PL1-n from respective memory cell arrays 10-1, 10-2, ..., 10-n to a ground node N1. The transistors 90-1, 90-2, ..., 90-n are similar to the transistor 90 in FIG. 1, coupling latch lines PL2-1, PL2-2, ..., PL2-n from respective memory cell arrays 10-1, 10-2, ..., 10-n to a power supply node N2.

The memory in FIG. 5 has a single shunt circuit 300 comprising capacitors 101 and 201, NMOS transistors 102-1, 102-2, ..., 102-n, 103, and PMOS transistors 202-1, 202-2, ..., 202-n, 203. The transistors 102-1, 102-2, ..., 102-n couple the latch lines PL1-1, PL1-2, ..., PL1-n to a shunt node N3. The transistor 103 couples the shunt node N3 to VSS. The capacitor 101 capacitively couples the shunt node N3 to VCC. The transistors 202-1, 202-2, ..., 202-n couple the latch lines PL2-1, PL2-2, ..., PL2-n to a shunt node N4. The transistor 203 couples the shunt node N4 to VCC. The capacitor 201 capacitively couples the shunt node N4 to VSS. Parasitic resistances R1 and R2 are as in FIG. 1.

Operation of this memory is as illustrated in FIG. 2 or 3, the signals LT1-1, ..., LT1-n being controlled like the signal LT1, the signals LT2-1, ..., LT2-n like the signal LT2, the signals LT3, ..., LT3-n like the signal LT3, and the signals LT4-1, ..., LT4-n like the signal LT4. Only one memory cell array is accessed at a time: in a given read cycle only one set of these signals, such as LT1-1, LT2-1, LT3-1, and LT4-1 for example, becomes active. Using a single shunt circuit 300 for n memory cell arrays allows benefits similar to those shown in FIGS. 2 and 3 to be obtained with only 1/n as much shunt circuit pattern area per memory cell array.

This invention is not restricted to the circuits described above, but permits further modifications as will be apparent to those skilled in the art. These modifications include, but are not limited to, the following.

In FIG. 1, either the shunt circuit 100 or the shunt circuit 200 (but not both) can be omitted. In this case the effect obtained is to reduce either the discharge current ISS or the charge current ICC. This modification will naturally be made in a memory having only n-channel sense amplifiers 50, or only p-channel sense amplifiers 60, but it can also be made in a memory having both n-channel and p-channel sense amplifiers, to reduce the amount of circuitry.

Similarly, in the shunt circuit 300 in FIG. 5 the transistor 103 and its associated nodes and connections can be omitted. Alternatively, the transistor 203 and its associated nodes and connections can be omitted.

The unit columns 20-1 to 20-m in FIG. 1 can be configured with circuits other than those shown in the drawings. For example, the equalizing circuit 30 can comprise PMOS transistors, or a combination of NMOS and PMOS transistors, or other elements. The circuit configurations of the sense amplifiers 50 and 60 and the transfer gate 70 can also be modified. Furthermore, the NMOS transistors 80, 80-1 to 80-n, and 103 and the PMOS transistors 90, 90-1 to 90-n, and 203 in FIGS. 1 and 5 can be replaced by other switching means.

What is claimed is:

1. A semiconductor memory, comprising:
   a memory cell array having a plurality of complementary pairs of bit lines and a plurality of sense amplifiers coupled to respective complementary pairs of bit lines;
   a first switching element for coupling said plurality of sense amplifiers to a first potential so that one bit line in each of said pairs of bit lines can be brought to said first potential;
   a shunt node;
   a capacitor for capacitively coupling said shunt node to a second potential different from said first potential;
   a second switching element for coupling said plurality of sense amplifiers to said shunt node; and
   a third switching element for coupling said shunt node to said first potential.

2. The memory of claim 1 wherein, during non-access periods, said first switching element and said second switching element are off and said third switching element is on.

3. The memory of claim 2 wherein, during read access, said third switching element is switched off, then said second switching element is switched on, then said second switching element is switched off, then said first switching element is switched on.

4. The memory of claim 2 wherein, during read access, said third switching element is switched off, then said second switching element and said first switching element are switched on simultaneously.

5. A semiconductor memory, comprising:
   a memory cell array having a plurality of complementary pairs of bit lines, a first plurality of sense amplifiers coupled to respective complementary pairs of bit lines, and a second plurality of sense amplifiers likewise coupled to respective complementary pairs of bit lines;
   a first switching element for coupling said first plurality of sense amplifiers to a first potential so that one bit line in each of said pairs of bit lines can be brought to said first potential;
   a first shunt node;
   a first capacitor for capacitively coupling said first shunt node to a second potential different from said first potential;
   a second switching element for coupling said first plurality of sense amplifiers to said first shunt node;
   a third switching element for coupling said first shunt node to said first potential;
   a fourth switching element for coupling said second plurality of sense amplifiers to said second potential so that another bit line in each of said pairs of bit lines can be brought to said second potential;
   a second shunt node;
   a second capacitor for capacitively coupling said second shunt node to said first potential;
   a fifth switching element for coupling said second plurality of sense amplifiers to said second shunt node; and
   a sixth switching element for coupling said second shunt node to said second potential.

6. The memory of claim 5 wherein, during non-access periods, said first switching element, said second switching element, said fourth switching element, and said fifth switching element are off, and said third switching element and said sixth switching element are on.

7. The memory of claim 6 wherein, during read access, said third switching element and said sixth switching element are switched off, then said second switching element and said fifth switching element are switched on, then said second switching element and said fifth switching element are switched off, then said first switching element and said fourth switching element are switched on.

8. The memory of claim 6 wherein, during read access, said third switching element and said sixth switching element are switched off, then said first switching element, said second switching element, said fourth switching element, and said fifth switching element are switched on simultaneously.

9. A semiconductor memory, comprising:
   N memory cell arrays, each having a plurality of complementary pairs of bit lines and a plurality of sense amplifiers coupled thereto, where N is a positive integer;
   N first switching element connected to respective memory cell arrays, for coupling said plurality of sense amplifiers in each of said memory cell arrays to a first potential so that one bit line in each of said pairs of bit lines can be brought to said first potential;
   a shunt node;
   a capacitor for capacitively coupling said shunt node to a second potential different from said first potential;
   N second switching element connected to respective memory cell arrays, for coupling said plurality of sense amplifiers in each of said memory cell arrays to said shunt node; and
   a third switching element for coupling said shunt node to said first potential.

10. The memory of claim 9 wherein, during non-access periods, said N first switching element and said N second switching element are switched off and said third switching element is switched on.

11. The memory of claim 10 wherein, during read access, said third switching element is switched off, then one of said N second switching element is switched on, then this one of said N second switching element is switched off, then a corresponding one of said N first switching element is switched on.

12. The memory of claim 10 wherein, during read access, said third switching element is switched off, then one of said N second switching element and a corresponding one of said N first switching element is switched on simultaneously.

* * * * *